United States Patent
Fechner et al.

(10) Patent No.: US 7,732,287 B2
(45) Date of Patent: Jun. 8, 2010

(54) METHOD OF FORMING A BODY-TIE

(75) Inventors: Paul S. Fechner, Plymouth, MN (US);
Gordon A. Shaw, Plymouth, MN (US);
Eric E. Vogt, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/415,703

(22) Filed: May 2, 2006

(65) Prior Publication Data

US 2007/0257317 A1 Nov. 8, 2007

(51) Int. Cl.
*H01L 21/336* (2006.01)

(52) U.S. Cl. .................. 438/296; 438/221; 438/427; 257/E21.548

(58) Field of Classification Search ............ 438/412, 438/164, 427, 157, 424, 221, 296; 257/E21.377, 257/E21.415, E21.546, E21.548, 548
See application file for complete search history.

(56) References Cited

U.S. PATENT DOCUMENTS

| | | | |
|---|---|---|---|
| 4,489,339 A | 12/1984 | Uchida | |
| 4,786,955 A | 11/1988 | Plus et al. | 357/23.7 |
| 4,809,056 A | 2/1989 | Shirato et al. | 357/71 |
| 5,145,802 A | 9/1992 | Tyson et al. | |
| 5,767,549 A | 6/1998 | Chen et al. | |
| 6,521,959 B2 | 2/2003 | Kim et al. | |
| 6,537,861 B1 | 3/2003 | Kroell et al. | 438/149 |
| 6,638,799 B2 * | 10/2003 | Kotani | 438/154 |
| 6,724,048 B2 | 4/2004 | Min et al. | |
| 6,864,152 B1 | 3/2005 | Mirbedini, et al. | |
| 6,953,809 B2 | 10/2005 | Faull et al. | |

(Continued)

FOREIGN PATENT DOCUMENTS

GB 2360874 A 3/2001

(Continued)

OTHER PUBLICATIONS

Wolf, Silicon Processing for the VLSI Era, vol. 2: Process Integration, 1990 by Lattice Press, pp. 143-147.*

(Continued)

*Primary Examiner*—Matthew Smith
*Assistant Examiner*—Julio J Maldonado
(74) *Attorney, Agent, or Firm*—Shumaker & Sieffert, P.A.

(57) ABSTRACT

A method of forming a body-tie. The method includes forming the body-tie during an STI scheme of an SOI process. During the STI scheme, a first trench is formed. The first trench stops before a buried oxide layer of the SOI substrate. The first trench may determine a height of body tie that is shared between at least two FETs. A second trench may also be formed within the first trench. The second trench stops in the SOI substrate. The second trench defines the location and shape of a body-tie. Once the location and shape of the body-tie are defined, an oxide is deposited above the body-tie. The deposited oxide prevents certain implants from entering the body tie. By preventing these implants, a source and a drain implant may be self-aligned to the source and drain areas without requiring the use of the photoresist mask to shield the body tie regions from the source and drain implant.

14 Claims, 7 Drawing Sheets

U.S. PATENT DOCUMENTS

| | | |
|---|---|---|
| 6,960,810 B2 | 11/2005 | Fechner |
| 7,179,717 B2 * | 2/2007 | Sandhu et al. ............... 438/424 |
| 2002/0123205 A1 * | 9/2002 | Iwamatsu et al. ........... 438/404 |
| 2003/0020117 A1 | 1/2003 | Lee et al. .................... 357/347 |
| 2004/0129975 A1 | 7/2004 | Koh et al. .................... 257/347 |
| 2005/0269637 A1 | 12/2005 | Iwamatsu et al. ........... 257/347 |

FOREIGN PATENT DOCUMENTS

| | | |
|---|---|---|
| GB | 2 360 874 A | 10/2001 |
| WO | 0225701 A2 | 3/2002 |
| WO | WO 02/25701 A2 | 3/2002 |

OTHER PUBLICATIONS

International Search Report for PCT/US2007/002774 dated Nov. 6, 2007.

Min, B.W., et al., "Partial Trench Isolated Body-Tied (PTIBT) Structure for SOI Applications," Oct. 2001, IEEE International SOI Conference, pp. 71-72.

International Preliminary Report on Patentability for PCT/US2007/002774, 9 pgs., dated Nov. 13, 2008.

* cited by examiner

METHOD OF FORMING A BODY-TIE

GOVERNMENT RIGHTS

The United States Government may have acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to the field of Field Effect Transistors (FETs) fabricated in a Silicon-On-Insulator (SOI) substrate and more particularly to a method of forming a body-tie between a body-contact and a body of a FET.

BACKGROUND

One issue that FETs fabricated in an SOI substrate may experience is a floating body effect. In such FETs, floating body effects are a result of having a body region that is electrically isolated from a bulk substrate. In order to supply a voltage potential to the body, and therefore mitigate floating body effects, an applied bias is often supplied from a body-contact to the body. When the body-contact receives an applied bias, which may be a ground or a positive or negative potential, it carries it to the body via a body tie. Often times, the body-tie is formed in device layer silicon and runs beneath an oxide.

In general, the body-tie allows the body region and the body-contact to be in remote locations in an SOI substrate. Unfortunately, however, the body-tie may be exposed to a variety of processing steps during the fabrication of a FET. Implant steps, for example, may cause ions to penetrate the oxide layer and alter a body-tie's conductive properties. To prevent such exposure, an SOI based process flow may need to include additional process steps to accommodate a body tie. In the example above, an additional photo-resist mask may be needed to prevent implantation into the body-tie. This and other types of accommodation increase process complexity and decrease yield.

SUMMARY

A body-tie and a method of forming a body-tie are presented. The method includes forming a first trench in a device layer of an SOI substrate. Then, a second trench is formed in a portion of the first trench. The second trench stops in an insulating layer of the SOI substrate. A portion of the device layer that is located below the first trench and alongside the second trench serves as the body-tie. In the described examples, the device layer is silicon and the insulating layer is silicon dioxide and the first and second trenches together form a multi-tiered trench.

Generally, the body-tie couples a FET body to a body-contact. The FET may be located in a silicon island that is next to the body tie. In one respect, the silicon island and the body-tie may be viewed as a multi-tiered silicon island. An upper tier provides locations for source, drain, body, and body-contact regions. A lower tier, which is buried beneath an isolation oxide, provides a body-tie location.

To reduce parasitic capacitance, the body-tie may be positioned so that it runs alongside the source region and not the drain region. To optimize area, the distance between at least two FETs may be reduced by sharing the body-tie. In one respect, the body-tie may be "self-aligned" with an edge of the first trench. Also, because the body-tie may be located below a thick oxide, a photo-resist mask may not be required to mask implants into the body-tie.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

Figures 1A, 1B:
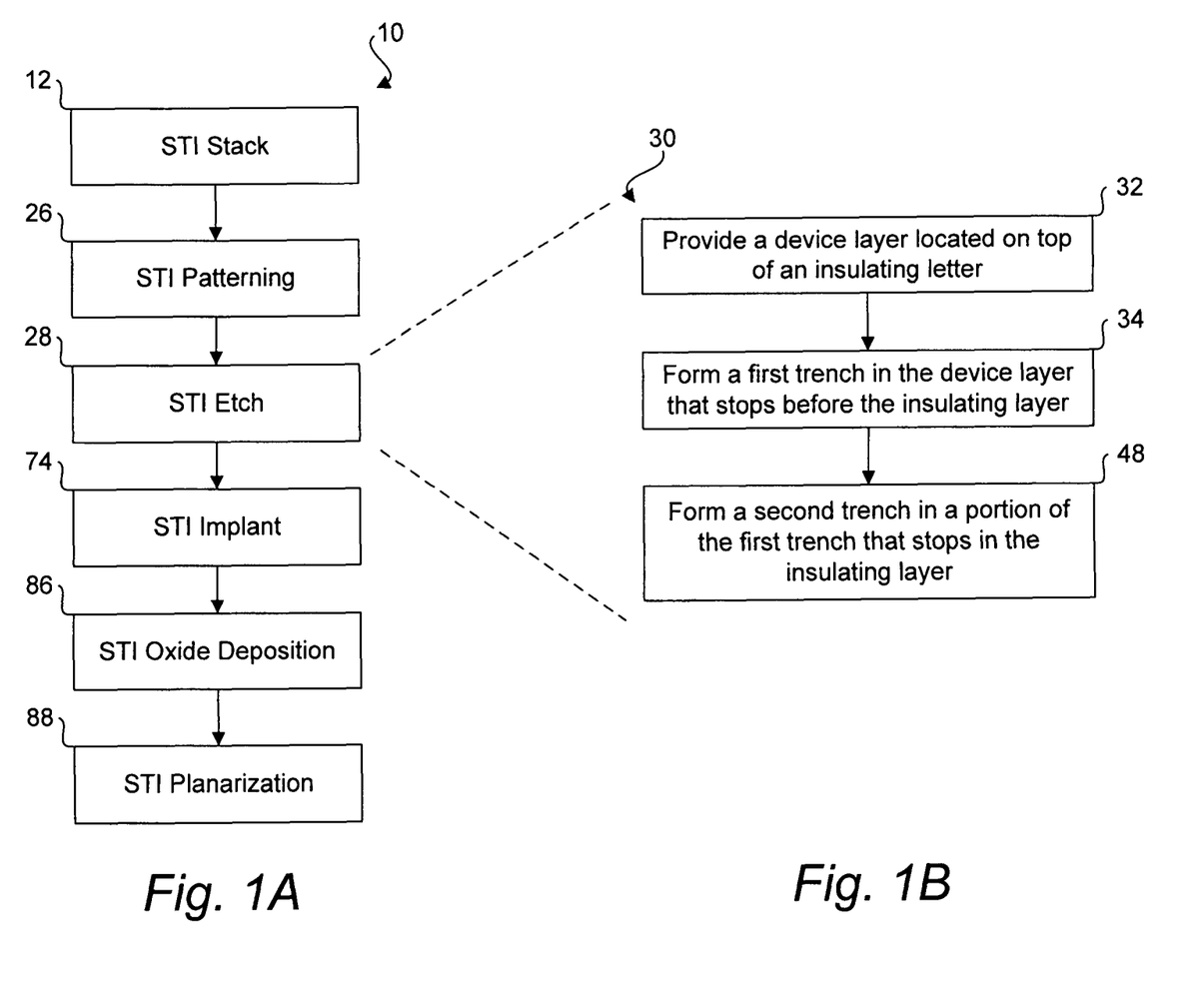
FIG. 1A is a flow diagram of an STI scheme.
FIG. 1B is a flow diagram of a method of forming a body tie in the STI scheme of FIG. 1A.

Turning now to the figures, FIG. 1A is a flow diagram of a Shallow Trench Isolation (STI) scheme 10. Typically, STI schemes provide electrical isolation between a variety of CMOS devices. Although this disclosure presents a modification of an STI scheme in an SOI process to achieve a body-tie, a body-tie may be created using other types of isolation schemes or patterning and etching steps.

Figure 2:
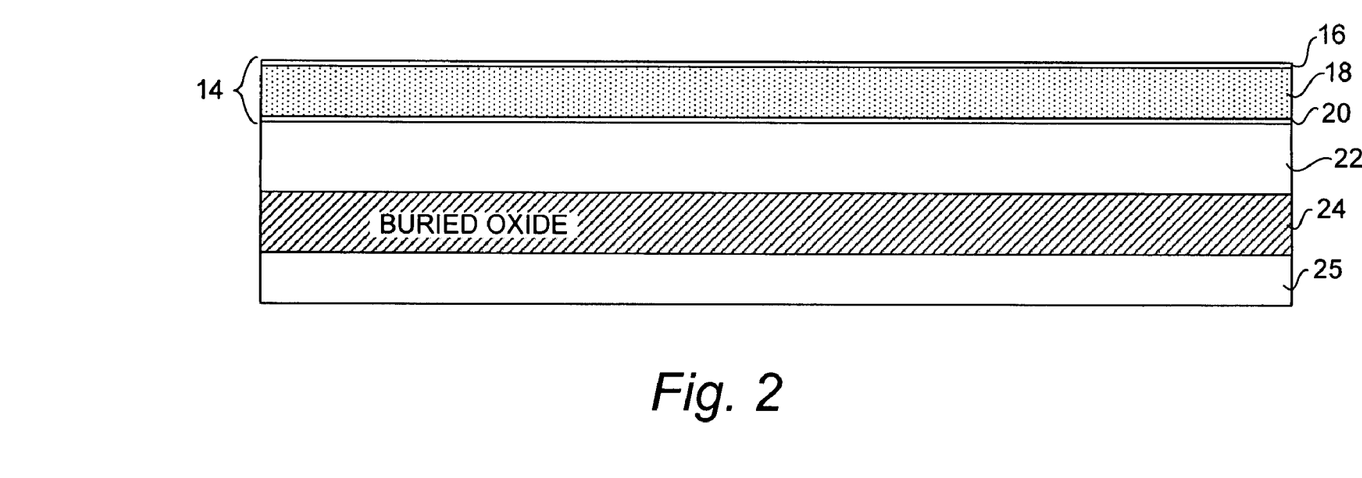
FIG. 2 is a cross-section of an STI stack on an SOI substrate.

In FIG. 1A, STI scheme 10 begins at block 12, where an STI stack is provided. FIG. 2 shows such an STI stack 14. Generally, STI stack 14 includes a thin oxide layer 16 located on top of nitride layer 18. The nitride layer 18 is located on top of a pad oxide layer 20. The pad oxide layer 22 is located on top of a silicon device layer 22. Device layer 22 is above a silicon dioxide insulating layer (buried oxide 24). Buried oxide 24 is on a bulk silicon substrate 25.

Returning to FIG. 1A, at block 26, a photoresist mask defines a "hard-mask" pattern in STI stack 14. After formation of the hard-mask, the photoresist may then be stripped.

At this point, to create a body-tie, block 28 of STI scheme 10 includes method 30. FIG. 1B is a flow diagram of method 30. Method 30 begins after the STI hard-mask is formed. In general, the SOI substrate will at least include a device layer located on top of an insulating layer, as shown at block 32.

Figure 3:
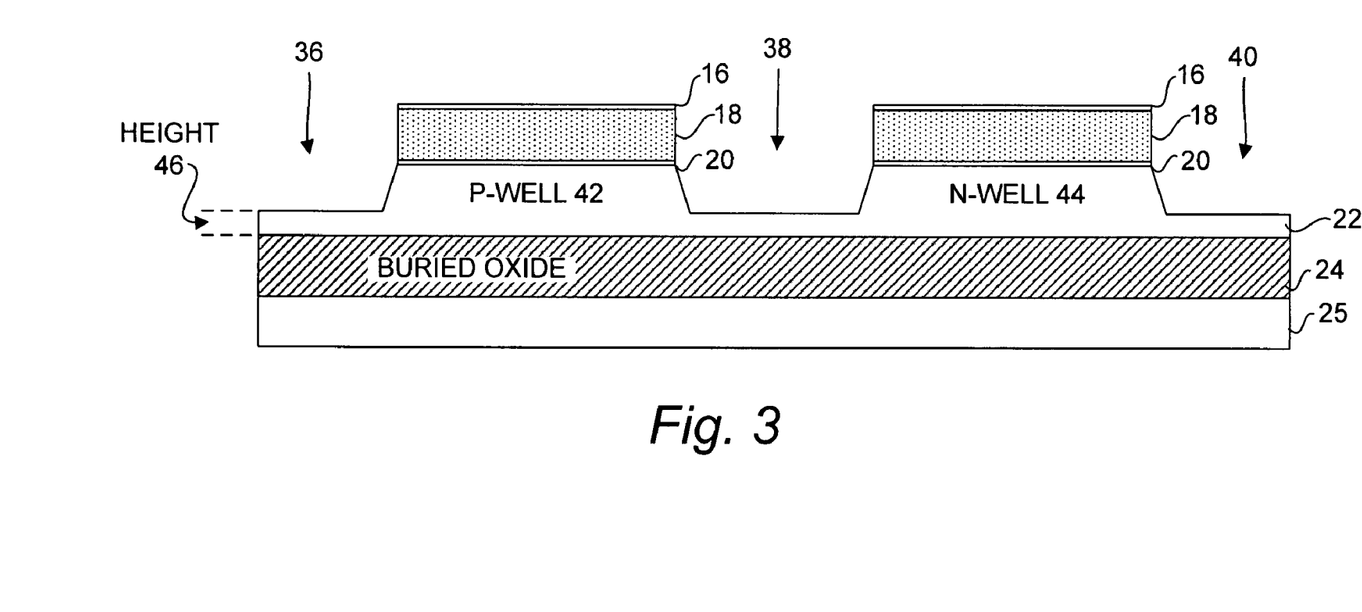
FIG. 3 is a cross-section of trenches formed in the SOI substrate.

In method 30, at least two silicon etches are performed. This contrasts standard STI processing in SOI, where a silicon etch stops in the buried oxide 24 (or stops on the buried oxide 24). Instead, the silicon etch stops before the buried oxide 24 and first trenches are created, shown at block 32. FIG. 3 is a cross-section showing this scenario.

In FIG. 3, device layer 22 includes first trenches 36, 38, and 40. Trench 38 isolates a P-type well 42 from an N-type well 44. Trenches 36 and 40, in a likewise manner, may separate P-well 42 and N-well 44 from other devices located in device layer 22. At this point in method 30, a thin portion of device layer 22 still exists in trenches 36, 38, and 40. By leaving this thin portion of device layer 22, the silicon etch establishes a height 46 of a body-tie. The time of the silicon etch, therefore, is inversely proportional to the height of the body-tie.

Figure 4:
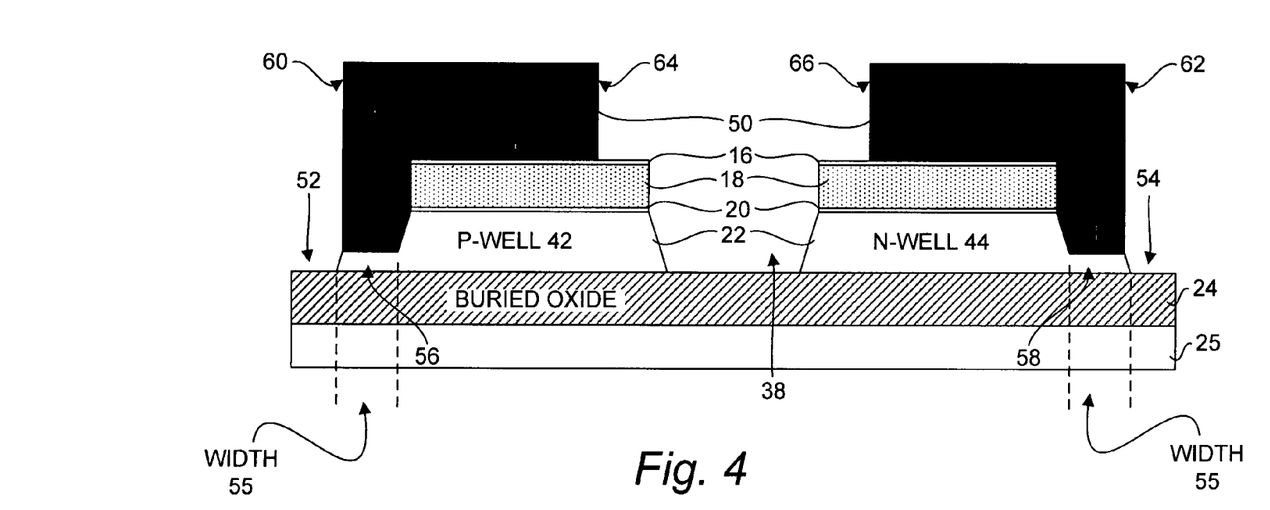
FIG. 4 is a cross-section of a photoresist mask used to form body-ties and silicon islands.

After the first trenches 36, 38, and 40 are created, a second silicon etch creates a second set of trenches shown at block 48 of method 30. In contrast to trenches 36, 38, and 40, these second trenches are not exclusively defined by the hard-mask. Instead, a photoresist mask defines them. In FIG. 4, photoresist mask 50 defines trenches 52 and 54. Trenches 52 and 54 define the location of body-ties 56 and 58. In addition, mask 50 establishes a width 55 of body-ties 56 and 58 via resist edges 60 and 62. Although not shown, mask 50 also establishes a length of body-ties 56 and 58.

In areas where a body-tie is not to be created, mask 50 may be open. For instance, mask 50 does not block the second silicon etch in trench 38. Therefore, P-well 42 is completely separated from N-well 44. However, in order to prevent shadowing in trench 38, resist edges 64 and 66 are offset from the hard-mask. If edges 64 and 66 are not offset, the slope of the sidewalls of trench 38 may, as a result of the shadowing, decrease. Beyond edges 60 and 62 mask 50 is also open; thus, P-well 42 and N-well 44 are completely separated from other devices within device layer 22.

Figure 5:
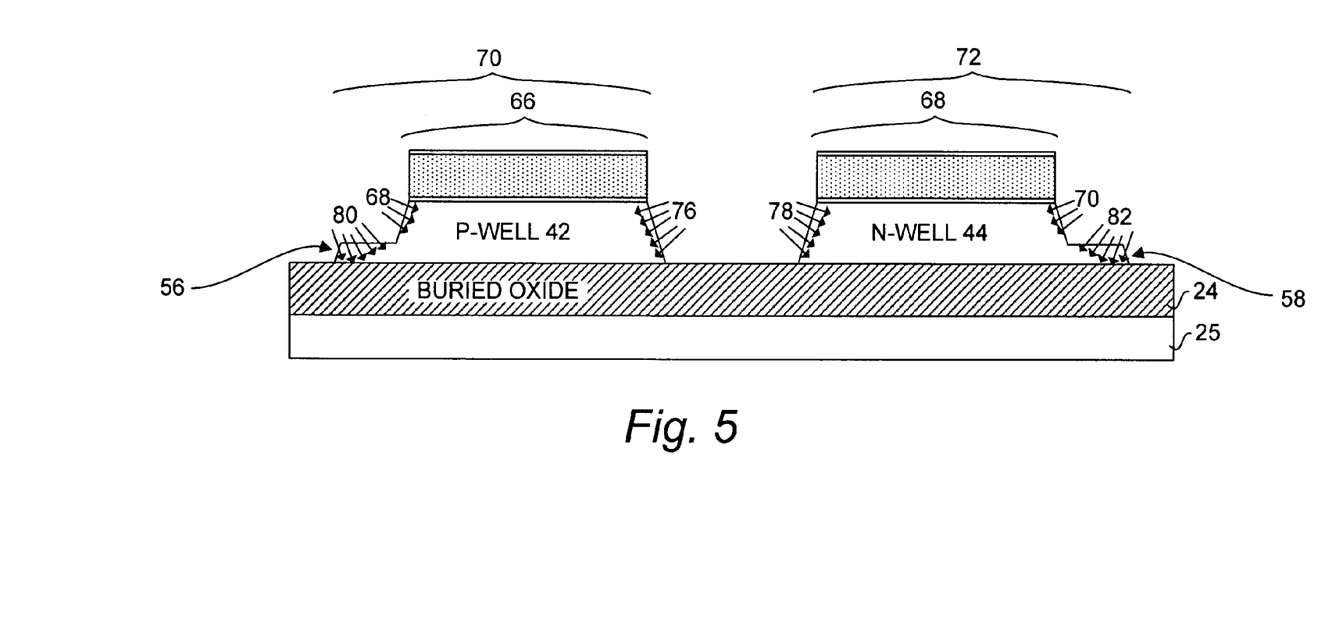
FIG. 5 is a cross-section of implanted body-ties and islands.

In FIG. 5, upon completion of the first and second silicon etches, mask 50 has been removed. Body-ties 56 and 58 and islands 66 and 68 are left behind. Island 66 includes P-well 42 and, upon completion of an SOI process flow, will also include an NFET. Similarly, island 68 includes N-well 44 and will include a PFET. In one respect, the combination of a body-tie and an island may be viewed as a multi-tiered island. For instance, body tie 56 and island 66 form a multi-tiered island 70. Likewise, body tie 58 and island 68 form a multi-tiered island 72. Both multi-tiered islands 70 and 72 will house source, drain, body, and body-contact regions for a FET. In addition, body ties 56 and 58 provide a coupling between the body-contact and body regions of a FET.

Returning now to FIGS. 1A and 1B, the STI etch process shown at block 28 of FIG. 1A is finished. Next, at block 74 of STI scheme 10, the body-ties and trenches undergo implantation. FIG. 5 also shows this scenario.

In FIG. 5, arrows 76, 78, 80, and 82 point to implantation areas that may be implanted at block 74. Arrows 76, for instance, point to a quad-type implant at the sidewalls of island 68. Arrows 78, on the other hand, point to another quad-type implant at the sidewalls of island 70. In addition to implanting the sidewalls, body ties 56 and 58 also receive implants, indicated by arrows 80 and 82. The implants should be tailored so that body ties 56 and 58 have a concentration that is sufficiently high enough to prevent subsequent-opposite species type-implants from reverting either body-tie to an intrinsic or an opposite type doping. If such a consideration is not given, a diode may form between a body-tie and a gate and a body-tie and a body-contact. This will be described further with reference to FIG. 11.

Figure 6:
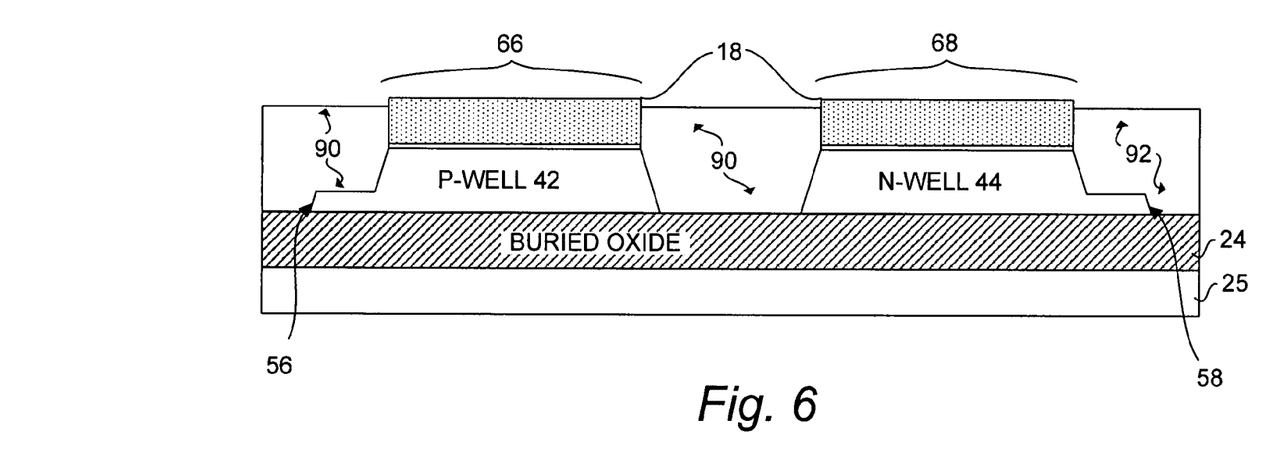
FIG. 6 is a cross-section of a planarized oxide layer located above the body-ties of FIG. 5.

Returning once again to FIG. 1A, at the final two blocks of STI scheme 10, an STI oxide is deposited at block 86, and is planarized (chemically mechanically polished) at block 88. FIG. 6 shows the outcome of the application of blocks 86 and 88. In FIG. 6, an STI oxide 90 covers body-ties 56 and 58 and also provides electrical isolation between islands 66 and 68. Additionally, STI oxide 90 electrically isolates islands 66 and 68 from other devices formed in the device layer.

Figure 7:
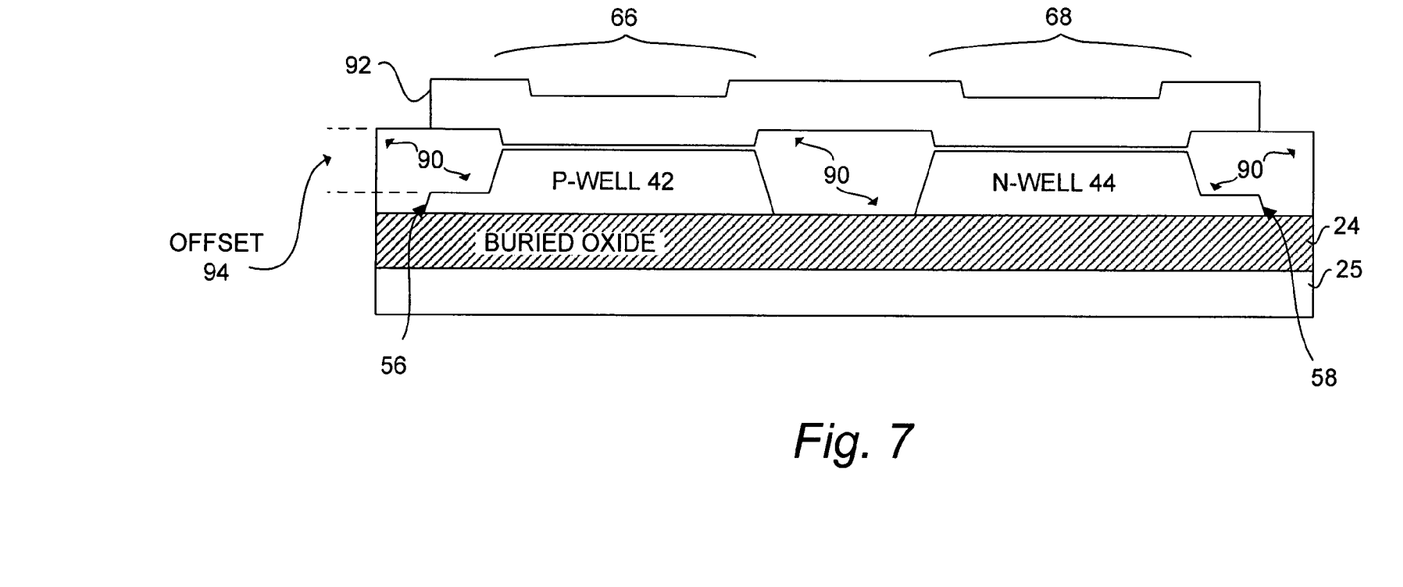
FIG. 7 is a cross-section of a polysilicon layer located above the body-ties and islands of FIG. 6.

Once the STI scheme 10 is complete, an SOI process continues to gate formation. In FIG. 7, the nitride layer 18 has been removed using a hot-phosphoric strip, for example. A polysilicon gate layer 92, which includes a thin gate oxide located below the polysilicon, is formed on top of islands 66 and 68. In addition, the STI oxide 90 may be thinned or etched prior to the nitride layer 18 being removed. This thinning may determine an offset 94 of the STI oxide 90 above body-ties 56 and 58. The offset 94 of STI oxide 90 protects body-ties 56 and 58 during subsequent implants. Implant protection will be further described with reference to FIG. 11.

Figure 8:
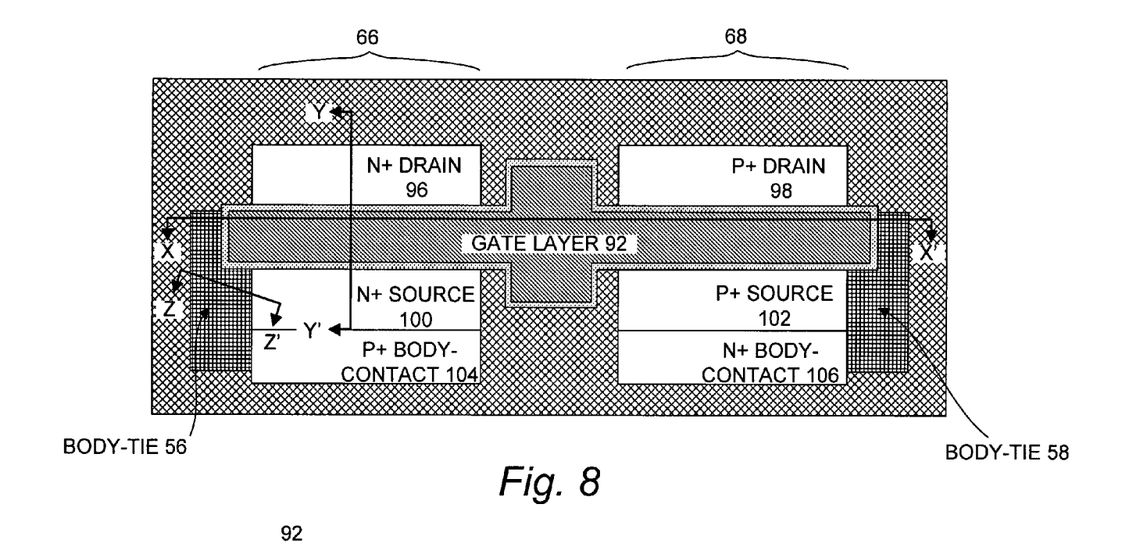
FIG. 8 is a top view of the body-ties and islands of FIG. 7.

After formation of the gate layer 92, a series of implants establishes the doping level of the source and drain regions. In order to illustrate where these implants take place, FIG. 8 shows a top view of cutting planes through islands 66 and 68 and body ties 56 and 58. In particular, FIGS. 9-11 respectively contain cross sections X-X', Y-Y', and Z-Z'. FIG. 8 also shows the locations of drain regions 96 and 98, source regions 100 and 102, and body-contact regions 104 and 106 of a respective NFET and PFET.

Figure 9:
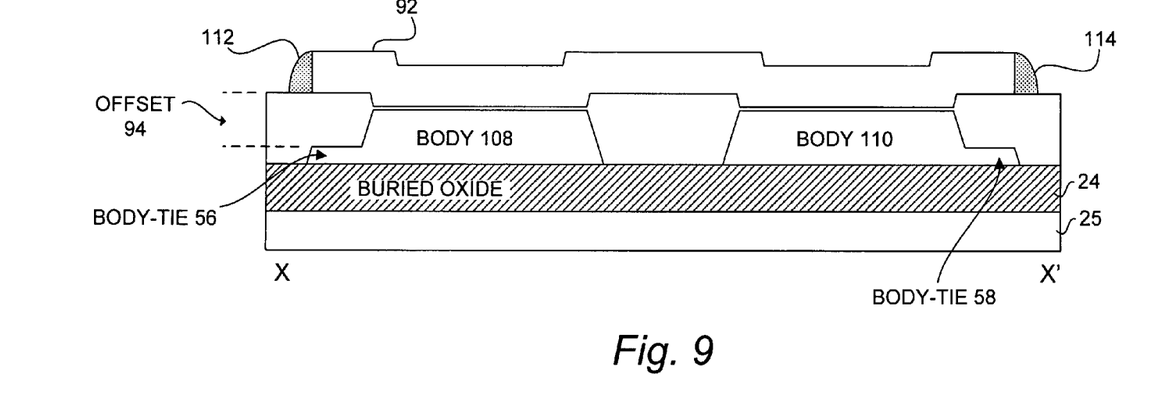
FIG. 9 is a cross-section through the top view of FIG. 8.

In FIG. 9, to illustrate body regions underneath gate layer 92, cross-section X-X' cuts through a body region 108 of island 66 and a body region 110 of island 68. FIG. 9 also shows nitride spacers 112 and 114 located alongside gate layer 92.

Figure 10:
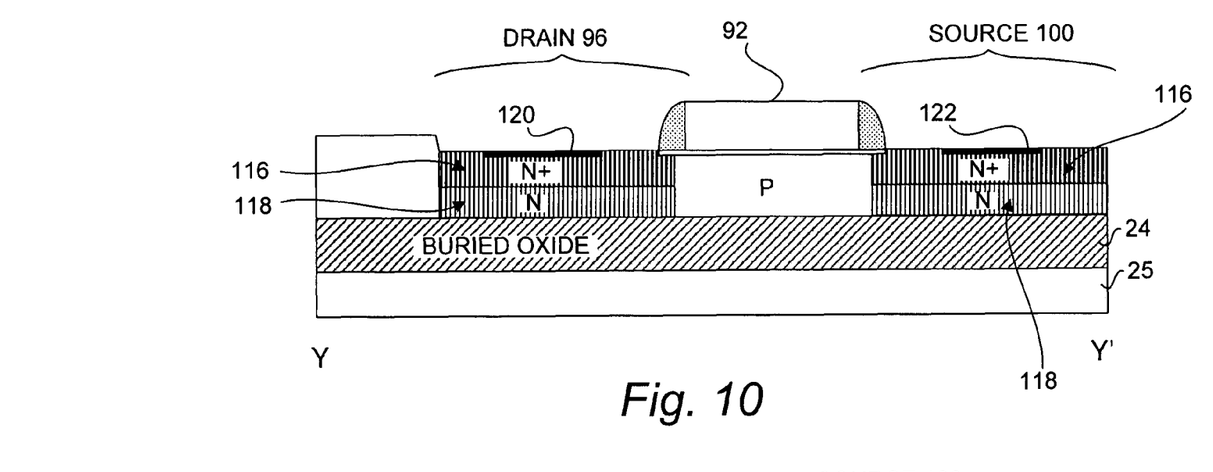
FIG. 10 is another cross-section cut through the top view of FIG. 8.

In FIG. 10, cross section Y-Y', which is perpendicular to cross section X-X', cuts through island 66. Drain 96 and source 100 show two implantation regions 116 and 118. The first region 116 is a shallow, heavily doped region for providing an ohmic contact with silicided regions 120 and 122. These silicided regions may be Ti-silicide or Co-silicide, for example. The first region has an average depth that is less than offset 94 (see FIG. 6). The second region 118 is a deeper, lightly doped region having an average depth that is greater than offset 94. In order to avoid altering the conduction properties of the channel region (between drain 96 and source 100), gate layer 92 should be sufficiently thick. If not, gate layer 92 will not mask the implants that create regions 116 and 118. To create the second region 118, a deeper implant bottoms out on the buried oxide 24 creating conduction paths under drain 96 and source 100. In a similar fashion, shallow and deep implants may also create lightly and heavily P-type doped regions in the drain 98 and source 102.

Figure 11:
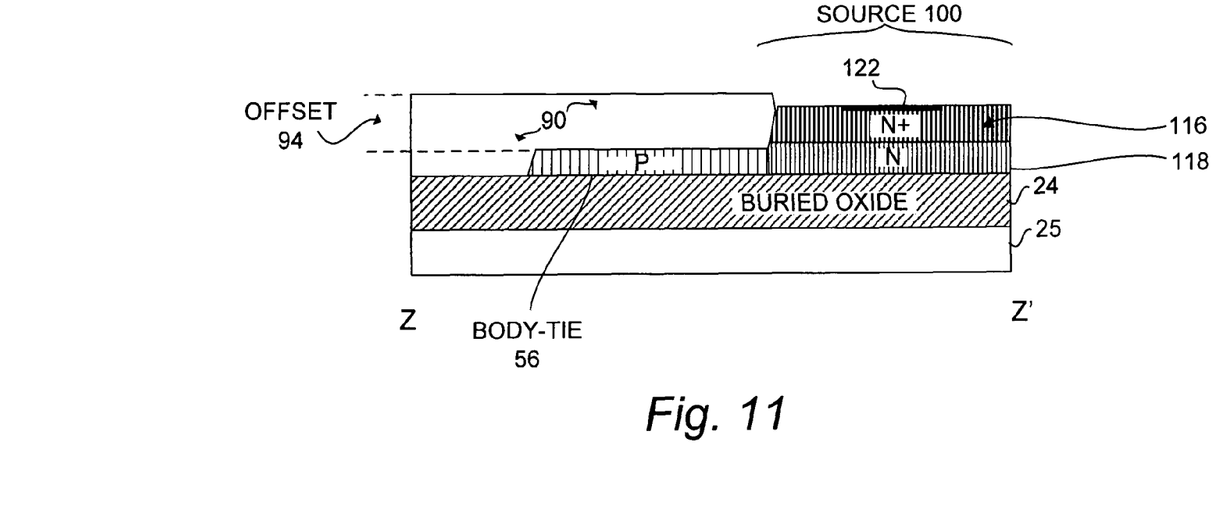
FIG. 11 is yet another cross-section cut through the top view of FIG. 8.

In FIG. 11, cross section Z-Z' cuts through source 100 and body tie 56. Because body-tie 56 is located below STI oxide 90, STI oxide 90 will mask the implant that creates region 116. However, the deep implant that creates region 118 may still penetrate into body-tie 56. By blocking the shallow implant, however, body tie 56 will remain of the same doping polarity as the body of the channel to provide the desired conductive path. However, as described above, if the body tie is not sufficiently doped at a previous step, a deep N-type implant may cause body-tie 56 to become intrinsic, or N-type. A P-N junction may be formed between body-contact 104 and body 108.

Because the STI oxide 90 may be tailored to a variety of thicknesses, proper offset 94 choice allows drains 96 and 98 and sources 100 and 102 to be implanted without requiring a photoresist mask or an extended gate layer to block heavy implants into the body-tie. Both of these attempts to block implants may lead to an increase in parasitic capacitance and/or device layout area. For instance, using a resist mask (in lieu of oxide layer 90 having offset 94) requires a significant increase in layout area due to the alignment and minimum line-width requirements associated with lithography steps. An extended gate layer, on the other hand, may increase parasitic capacitance by allowing an electric field to develop over the body tie. In essence, by eliminating the need for these types of masks, the implants into drains 96 and 98 and sources 100 and 102 may be truly self aligned.

Another way to reduce parasitic capacitance in body-ties 56 and 58 is to align them alongside sources 100 and 102. In this manner, drains 96 and 98 may be walled in and a capacitance between the drains 96 and 98 and body-ties 56 and 58 will not develop. This type of alignment is demonstrated in FIG. 8.

Figure 12:
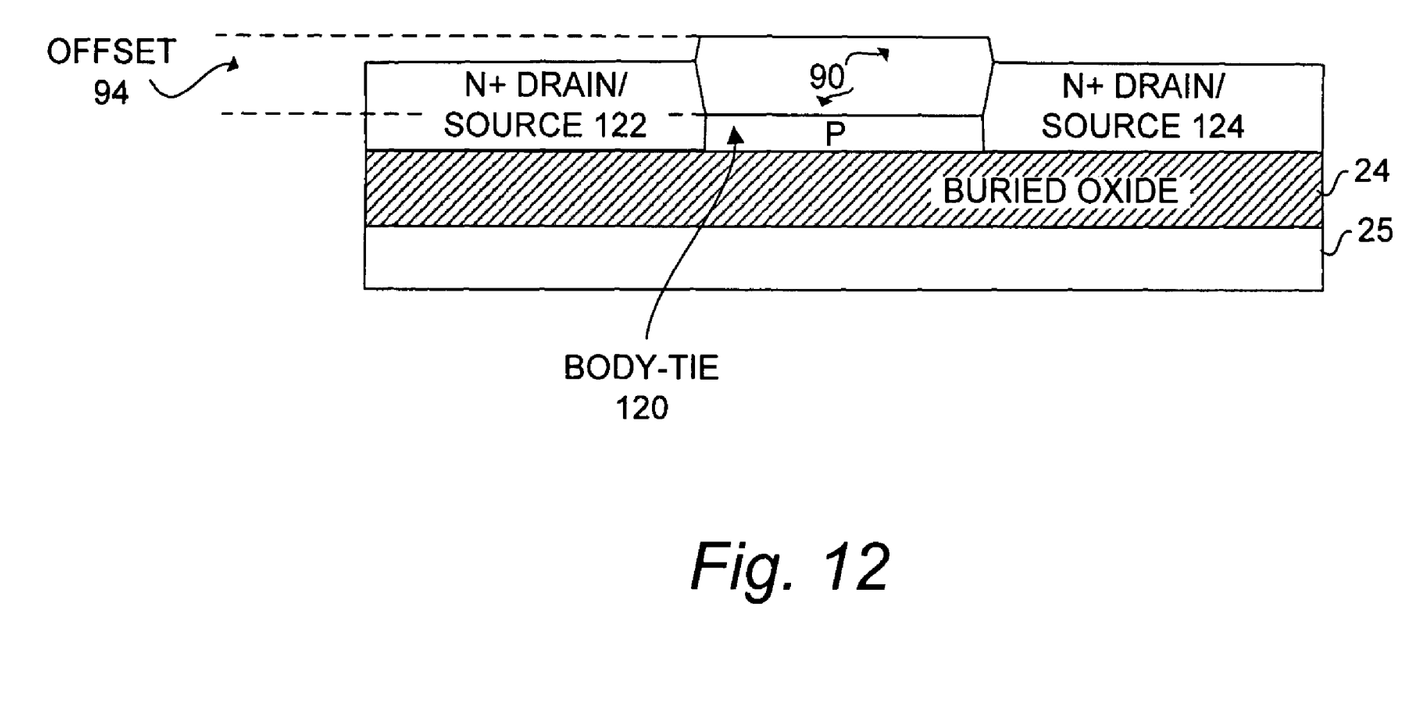
FIG. 12 is a cross-section of two body regions sharing a body-tie.

Not only may a body-tie be placed for the most favorable capacitance, it may also be optimally placed to improve area efficiency. Two FETs, for instance, may share a body tie: FIG. 12 shows body tie 120 coupled to body regions 122 and 124. Two separate FETs may include one of these body regions. Body-tie 120 may be manufactured in a similar fashion as method 32.

Any number of FETs may share body-tie 120. By sharing a body-tie, the distance between at least two FETs may be minimized. In some instances, the second trench (formed at block 48) may not be formed within the first trench (formed at block 34). Instead, the first trench stops before the buried oxide and leaves the remaining portion of the device layer to be the body-tie. In such a scenario, a transistor may be surrounded by body-tie regions and may not require the electrical isolation that the second trench provides.

Although the presented method has been described with reference to an STI scheme in an SOI process, it may, however, be carried out at other points of an SOI process. The presented body-tie may be particularly advantageous in radiation hardened circuits. Such circuits may use a body-contact along with the described body-tie to mitigate ion induced glitching and state changes. However, it is also contemplated that such a body-tie may also be used where appropriate in a non-radiation hardened circuit. It should be understood, therefore, that the illustrated examples are examples only and should not be taken as limiting the scope of the present invention. For instance, the term "deposited" is used generically to refer to the known growth, Chemical Vapor Deposition (CVD), plasma enhanced CVD, and other methods of fabricating dielectric or other semiconductor related films. Also, the claims presented below should not be read as limited to the described order or elements unless stated to that effect. Therefore, all examples that come within the scope and spirit of the following claims and equivalents thereto are claimed as the invention.

We claim:

1. A method of forming a body-tie, the method comprising:
    etching a first trench into a device layer of a Silicon-On-Insulator (SOI) substrate, wherein the first trench stops short of art insulating layer of the SOI substrate, and wherein the device layer underlies an STI stack comprising at least a nitride layer and an oxide layer covering the nitride layer;
    masking a portion of the first trench with a mask that establishes a location of the body-tie;
    etching a second trench into an unmasked portion of the first trench, wherein the second trench extends to the insulating layer, and wherein the nitride layer is not thinned by the etching of the second trench;
    forming a Shallow Trench Isolation (STI) oxide above the first and second trenches;
    doping drain and source regions of the device layer at a first doping density having a first average depth from a top surface of the device layer, the first average depth being less than a thickness of the STI oxide above the first trench; and
    doping the drain and the source regions at a second doping density having a second average depth from the top surface of the device layer, the second average depth being greater than a thickness of the STI oxide above the first trench and having a doping density that is less than a doping density of the body-tie, thereby preventing the body-tie from switching majority carrier type.

2. The method as in claim 1, the STI oxide blocking a subsequent implant into the body-tie, wherein the implant provides an ohmic coupling with at least one silicided contact to a source/drain region.

3. The method as in claim 2, wherein the body-tie is coupled to a field effect transistor in the device layer that includes drain, source, body, and body-contact regions.

4. The method as in claim 3, wherein the body-tie provides an electrical coupling of the body region to the body-contact region.

5. The method as in claim 3, wherein the mask overlaps a portion of an island that is adjacent to the body-tie, the mask overlap being determined so as to prevent shadowing of silicon adjacent to the island from removal by the etch caused by a misalignment of said masking layer beyond an edge of the island.

6. The method as in claim 2, wherein the body-tie is aligned adjacent to the source region and not adjacent to the drain region, thereby reducing parasitic capacitance.

7. The method as in claim 2, wherein the body-tie is aligned adjacent to a portion of a source region of the drain/source region and is not adjacent to a drain region of the drain/source region.

8. A method of forming a body-tie, the method comprising:
    providing a silicon layer located on top of a silicon dioxide layer;
    providing at least a nitride layer on top of the silicon layer;
    providing an oxide layer on top of the nitride layer; and
    etching a multi-tiered trench into the silicon layer and forming a silicon island, wherein the multi-tiered trench i) establishes a location of the body-tie ii) provides electrical isolation by extending to the silicon dioxide layer; and iii) includes at least first and second trenches, wherein the first trench stops short of the silicon dioxide layer and the second trench extends to the silicon dioxide layer, and wherein the nitride layer is not thinned by the etching that extends to the silicon dioxide layer;
    forming a Shallow Trench Isolation (STI) oxide above the first and second trenches;
    doping drain and source regions of the silicon island at a first doping density having a first average depth from a top surface of the silicon island, the first average depth being less than a thickness of the STI oxide above the trench; and
    doping the drain and the source regions at a second doping density having a second average depth from the top surface of the silicon island, the second average depth being greater than a thickness of the STI oxide above the first trench and having a doping density that is less than a doping density of the body-tie, thereby preventing the body-tie from switching majority carrier type.

9. The method as in claim 8, wherein the body-tie is located next to a silicon island that includes a body region and a body-contact region, the body-tie coupling the body region to the body-contact region.

10. The method as in claim 9, further comprising:
forming a gate stack on top of the body region, the gate stack being positioned so that it is above the silicon island not the body-tie.

11. The method as in claim 9, further comprising:
forming a gate stack on top of the body region, the gate stack having a predetermined thickness that prevents subsequent implantation processing from doping the body-region.

12. The method as in claim 8, wherein the body-tie is shared by at least two field effect transistors.

13. The method as in claim 8, wherein the first doping density is greater than the second doping density.

14. The method as in claim 13, wherein the first doping density allows for an ohmic contact with the silicon island to be achieved.

* * * * *

UNITED STATES PATENT AND TRADEMARK OFFICE
CERTIFICATE OF CORRECTION

PATENT NO. : 7,732,287 B2  Page 1 of 1
APPLICATION NO. : 11/415703
DATED : June 8, 2010
INVENTOR(S) : Fechner et al.

It is certified that error appears in the above-identified patent and that said Letters Patent is hereby corrected as shown below:

Column 5, line 54 (Claim 1) "short of art" should be -- short of an --

Signed and Sealed this
Twenty-sixth Day of June, 2012

David J. Kappos
*Director of the United States Patent and Trademark Office*